(12) United States Patent
Joshi

(10) Patent No.: US 7,919,991 B1
(45) Date of Patent: Apr. 5, 2011

(54) COMPARATOR CIRCUIT

(75) Inventor: Sachin Joshi, Fremont, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 124 days.

(21) Appl. No.: 12/499,771

(22) Filed: Jul. 8, 2009

Related U.S. Application Data

(60) Provisional application No. 61/079,080, filed on Jul. 8, 2008.

(51) Int. Cl.
*G01R 29/00* (2006.01)
*H03D 3/00* (2006.01)
*H03D 9/00* (2006.01)

(52) U.S. Cl. .................. 327/2; 327/3; 327/12; 708/207
(58) Field of Classification Search ............... 327/2, 12; 708/207
See application file for complete search history.

(56) References Cited

U.S. PATENT DOCUMENTS

| | | |
|---|---|---|
| 5,295,090 A | 3/1994 | Hsieh et al. |
| 5,481,206 A | 1/1996 | New et al. |
| 5,751,622 A | 5/1998 | Purcell |
| 6,175,513 B1 | 1/2001 | Khanna |
| 2004/0249873 A1 * | 12/2004 | Stark et al. ............ 708/207 |

* cited by examiner

*Primary Examiner* — Lincoln Donovan
*Assistant Examiner* — John W Poos
(74) *Attorney, Agent, or Firm* — Mahamedi Paradice Kreisman LLP; William L. Paradice, III

(57) ABSTRACT

A comparator circuit is disclosed that determines whether a first binary value is greater than, equal to, and/or less than a second binary value without employing binary adder circuits, and therefore is simpler, occupies less circuit area, and consumes less power than conventional comparator circuits having binary adders. For some embodiments, the comparator circuit is capable of performing full comparison operations on two or more arbitrary binary values. The comparator circuit can be implemented in TCAM devices to perform regular expression search operations.

15 Claims, 13 Drawing Sheets

Schematic Symbol For Full Adder

COMPARATOR CIRCUIT

CROSS-REFERENCE TO RELATED APPLICATION

This application claims the benefit under 35 USC 119(e) of the co-pending and commonly owned U.S. Provisional Application No. 61/079,080 entitled "Comparator Circuit" filed on Jul. 8, 2008, which is incorporated by reference herein.

FIELD OF INVENTION

The present invention relates generally to comparator circuitry, and more particularly to comparator circuitry for comparing binary values.

DESCRIPTION OF RELATED ART

Regular expression search operations are employed in various applications including, for example, intrusion detection systems (IDS), virus protections, policy-based routing functions, internet and text search operations, document comparisons, and so on. A regular expression can simply be a word, a phrase or a string of characters. More complex regular expressions include metacharacters that provide certain rules for performing the match. Some common metacharacters are the wildcard ".", the alternation symbol "|", and the character class symbol "[ ]." For example, a character class can specify any number of arbitrarily selected characters, and if an input character matches any of the specified characters, then a character class match condition is achieved. Regular expressions can also include quantifiers such as "*" to match 0 or more times, "+" to match 1 or more times, "?" to match 0 or 1 times, {n} to match exactly n times, {n,} to match at least n times, and {n,m} to match at least n times but no more than m times. Further, quantifiers are often associated with character classes in a regular expression.

For example, for an input string to match the regular expression R1="Y[I-P]{3}NG", the first character of the input string must match the prefix 'Y', each of the next n=3 input characters (i.e., the second, third, and fourth input characters) must match one of the characters [I-P], and the next two input characters (i.e., the fifth and sixth input characters) must match the suffix 'NG.' Thus, the exemplary input strings "YJKLNG" and "YPPPNG" both match R1. However, the input string "YHJKNG" would not match R1 because 'H' is not part of the character class [I-P], and the input string "YPPPPNG" would not match R1 because the fourth 'P' does not match the 'N' following the quantified character class [I-P]{3}.

Traditionally, regular expression searches have been performed using software programs executed by one or more processors. However, as both the number and complexity of regular expressions for applications such as intrusion detection systems continue to increase, software solutions are less able to achieve desired search speeds and throughput. As a result, hardware solutions employing ternary content addressable memory (TCAM) devices are being developed that can implement and perform regular expression search operations at faster speeds than software solutions typically allow. To search an input string for regular expressions having quantifier values using TCAM devices, it is sometimes necessary to determine whether a number A of input characters is greater than and/or equal to the quantified character number B. For example, for the above regular expression R1="Y[I-P]{3}NG", it is necessary to determine when the number A of input characters that match the character class [I-P] becomes greater than or equal to ($\geq$) the specified number n=B=3.

Typically, conventional counter circuits are used to determine whether A>B. Conventional counter circuits typically employ well-known binary adder circuits that subtract B from A to generate a difference D, which is then compared with zero to determine whether A>B. Although effective in determining whether A>B, conventional counter circuits that employ binary adders occupy a significant amount of circuit area and consume considerable power.

For example, FIGS. 1A-1B illustrate a well-known single bit ripple carry adder that adds two bits $A_i$ and $B_i$ to generate a sum bit $S_i$, a carry bit $C_{i+1}$, a generate bit $G_i$, and a propagate bit $P_i$. The sum bit is given as $S_i=(A_i \oplus B_i) \oplus C_{i-1}$ and the carry bit is given as $Ci=A_iB_i+(A_i \oplus B_i)C_{i-1}$, where $\oplus$ is the exclusive-OR function. Note that the sum signal is a function of a carry-in from a less significant bit in addition to the single input bits, and thus the sum for a particular bit cannot be calculated until the carry-out from the previous bit is available. Furthermore, the carry-out bit $C_{i+1}$ also cannot be generated until the less significant carry bit $C_i$ is available. The need to ripple carry information across bits limits the speed of such adder circuits.

To increase the speed of binary adders, look-ahead carry logic can be added to the binary adder circuit of FIGS. 1A-1B, as illustrated in FIG. 3. The look-ahead carry logic utilizes propagate and generate signals, where the propagate signal is given as $P_i=A_i \oplus B_i$ and the generate signal is given as $G_i=A_iB_i$. An asserted logic high propagate signal causes the carry-in signal to propagate as the carry-out signal, and an asserted logic high generate signal causes generation of the carry-out signal.

Although faster than ripple-carry adder circuits, adder circuits with look-ahead carry logic are much more complex, consume significantly more circuit area, and consume more power. However, to perform fast regular expression search operations, the number of character matches between an input string and a quantified character class should be determined quickly. Further, because a TCAM device configured to search an input string for regular expressions may include many counter circuits, it is desirable to minimize the circuit area and power consumption of such circuits.

Thus, there is a need for an apparatus and method to quickly compare binary numbers using minimal circuitry.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1A:
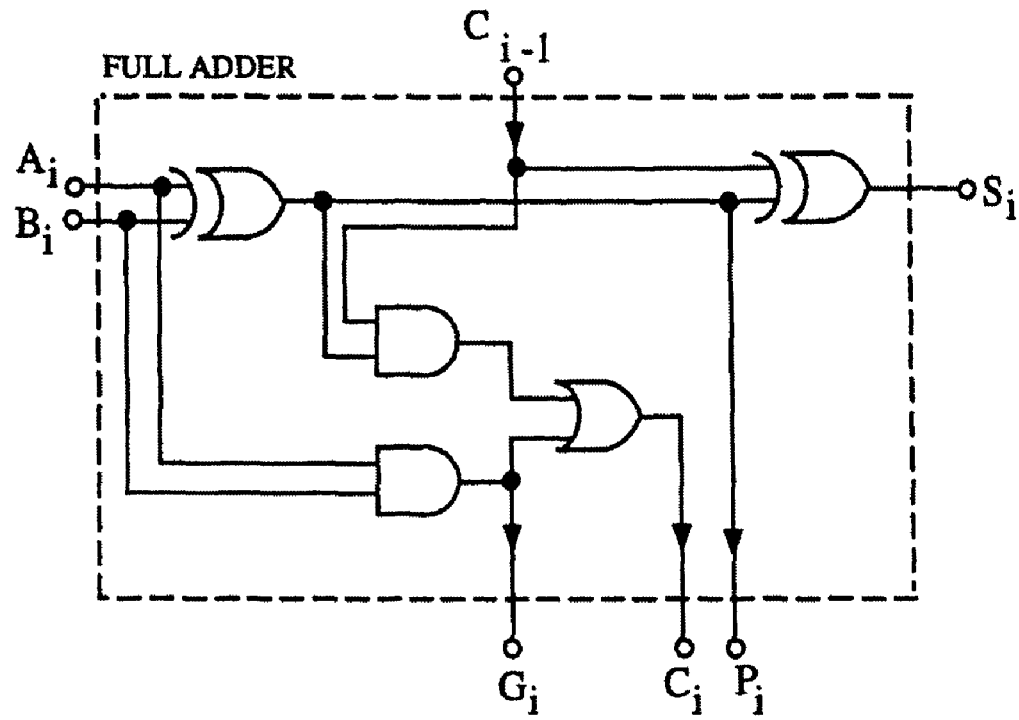
FIG. 1A is a schematic diagram of a single-bit binary adder circuit.
Figure 1B:
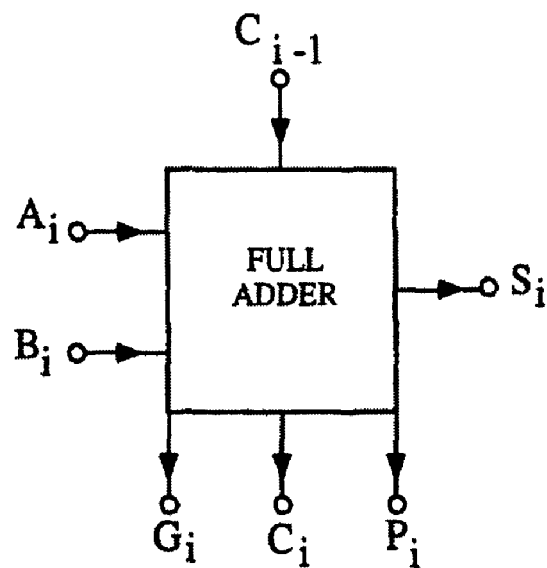
FIG. 1B is a block diagram of the single-bit binary adder circuit of FIG. 1A.
Figure 1C:
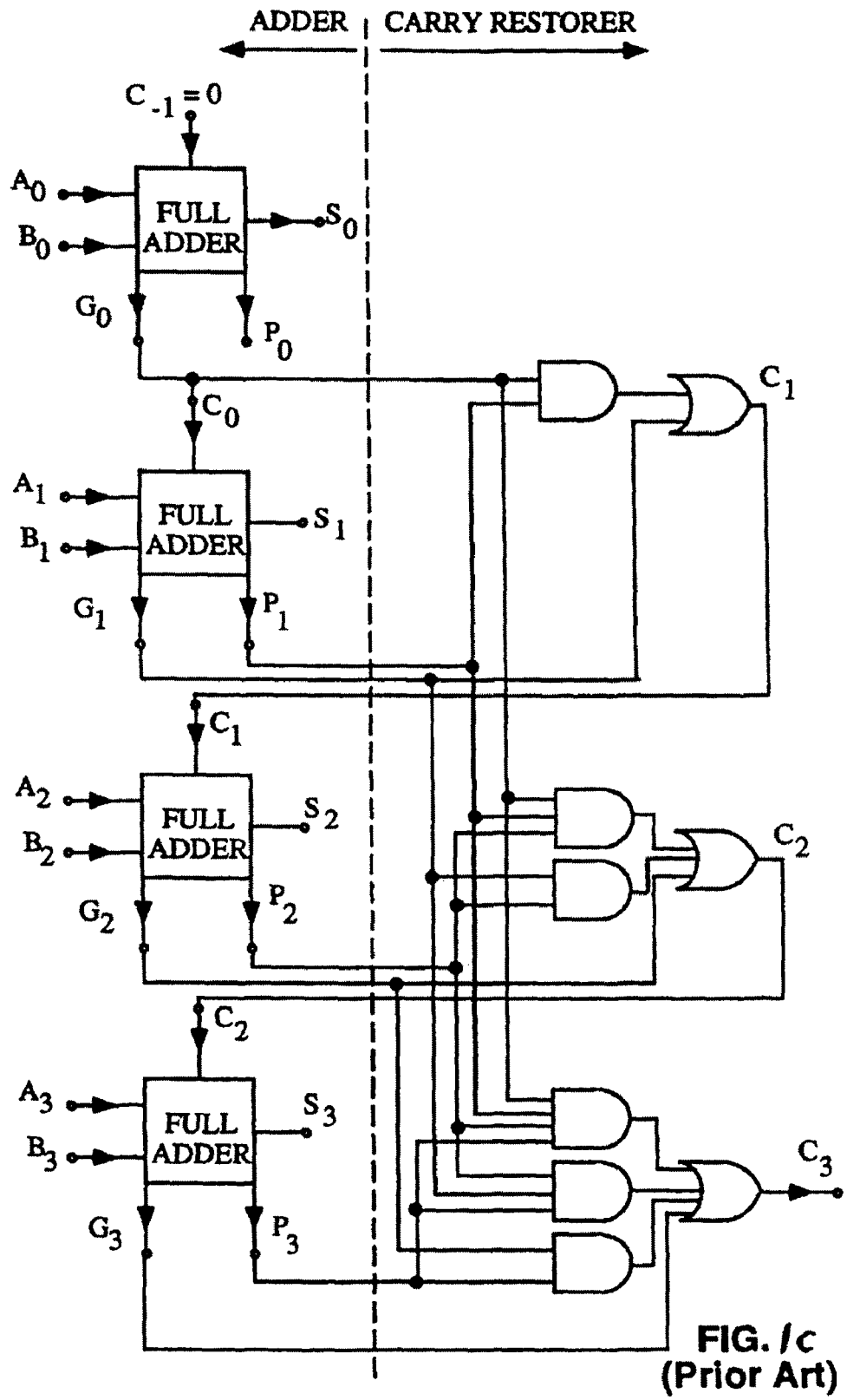
FIG. 1C is a schematic diagram of 4-bit binary adder circuit with look-ahead carry logic.

A method and apparatus for comparing binary values is disclosed. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. As another example, circuits described or depicted as including metal oxide semiconductor (MOS) transistors may alternatively be implemented using bipolar transistors or any other technology in which a signal-controlled current flow may be achieved. Also, signals referred to herein as clock signals may alternatively be strobe signals or any other signals that provide timing control. Furthermore, dynamic or domino logic circuits described herein, where transistors driven by clock signals are used to pre-charge outputs of the circuits, may be alternatively implemented as static complementary MOS (CMOS) circuits. For exemplary embodiments described herein, a signal is "asserted" when driven to a logic high state and is "de-asserted" when driven to a logic low state. Of course, for other embodiments, a signal can be asserted by driving it to a logic low state and de-asserted by driving it to a logic high state. Further, a line over a signal name (e.g., "$\overline{\text{signalname}}$") or an exclamation mark before a signal name (e.g. "!signal_name") is used to indicate a complemented signal. Accordingly, the present invention is not to be construed as limited to specific examples described herein but rather includes within its scope all embodiments defined by the appended claims.

Comparator circuits in accordance with present embodiments determine whether a first binary value is greater than, equal to, and/or less than a second binary value without employing binary adder circuits, and therefore are simpler, occupy less circuit area, and consume less power than conventional comparator circuits having binary adders. For some embodiments, the comparator circuit is capable of performing full comparison operations on two or more arbitrary binary values. Hereinafter, the term "complete comparison" or "full comparison" is used to describe a comparison operation that generates a greater than, an equal to, and/or a less than signal between two values. Any two of the three aforementioned signals may be used to generate the remaining of the three signals using simple combinational logic. For example, a greater than signal and a less than signal can be logically combined in a NOR gate to generate an equal to signal. Therefore, for some exemplary embodiments described herein, a full comparator circuit is only shown to as generating a selected two of the three aforementioned result signals.

For some embodiments, the comparator circuit is connected to a counter circuit form a counter-comparator circuit that generates a monotonically-increasing count value and compares the count value with an input value. Such embodiments can be used in TCAM devices configured to implement regular expression search operations to determine the number of input characters that match a character class specified by the regular expression.

Figure 2:
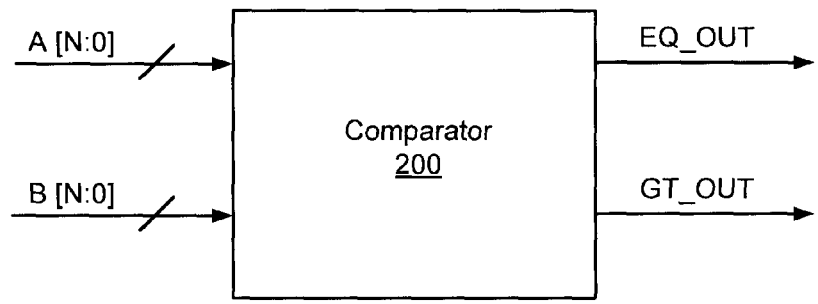
FIG. 2 illustrates an embodiment of a comparator circuit in accordance with present embodiments.

FIG. 2 illustrates one embodiment of a comparator circuit 200 for comparing two binary values A and B to generate an output equal signal EQ_OUT and an output greater than signal GT_OUT, where EQ_OUT indicates whether A is equal to B and GT_OUT indicates whether A>B. The comparator circuit 200 has inputs to binary values A[N:0] and B[N:0], each of which includes N+1 bits, where N is an integer greater than 0. An individual bit of binary value A may be represented by A[n] or $A_n$, where n is an integer between 0 and N, inclusive, and where $A_n$ is the n-th bit of A. $A_N$ represents the most significant bit (MSB) of A, and $A_0$ represents the least significant bit (LSB) of A. The individual bits of binary value B may be represented herein using similar notation.

The comparator circuit 200 has two outputs to generate EQ_OUT and GT_OUT. For exemplary embodiments described herein, EQ_OUT is de-asserted to logic low to indicate that A does not equal B, and EQ_OUT is asserted to logic high to indicate that A equals B. GT_OUT is de-asserted to logic low to indicate that A is not greater than B, and GT_OUT is asserted to logic high to indicate that A is greater than B. Although the exemplary embodiment of FIG. 2 is shown to generate EQ_OUT and GT_OUT, for other embodiments, the comparator circuit 200 may be configured to also generate a less than signal LT_OUT indicating whether A<B. The logical relationship between A>B, A=B, and A<B can be expressed as:

$$(A<B) = \overline{(A>B)} \cdot \overline{(A=B)} = \overline{(A>B) + (A=B)}$$

Thus, a NOR gate may be added to the circuitry within comparator 200 to generate LT_OUT from GT_OUT and EQ_OUT.

Figure 3:
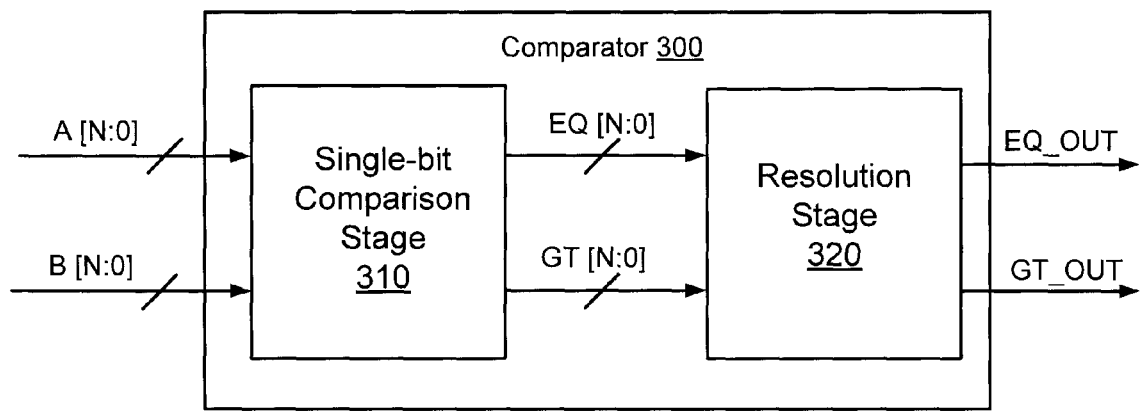
FIG. 3 is a functional block diagram illustrating an exemplary embodiment of the comparator circuit of FIG. 2.

FIG. 3 is a functional block of comparator circuit 300 that is one embodiment of comparator circuit 200 of FIG. 2. The comparator circuit 300 includes a single-bit comparison (SBC) stage 310 and a resolution stage 320. For each corresponding pair of bits of A and B (e.g., $A_0$ and $B_0$), the single-bit comparison stage 310 performs a comparison between the two bits to generate a respective single-bit equality signal EQ (e.g. $EQ_0$) and a respective single-bit greater than signal GT (e.g. $GT_0$).

Hereinafter, a single-bit equality signal and a single-bit greater than signal correspond to an equality signal and a greater than signal that indicates a comparison result between a single bit of A and a corresponding bit of B. For example, the single-bit equality single $EQ_0$ indicates whether $A_0=B_0$, and the single-bit greater than signal GT[0 . . . 3] indicates whether $A_0>B_0$. A multi-bit equality signal and a multi-bit greater than signal correspond to an equality signal and a greater than signal that indicates a comparison result between a multiple-bit subsequence of A and a corresponding multiple-bit subsequence of B. For example, the multi-bit equality signal EQ[0 . . . 3] indicates whether A[3:0]=B[3:0], and the multi-bit greater than signal GT[0 . . . 3] indicates whether A[3:0]>B[3:0].

The resolution stage 320 receives the single-bit EQ and GT signals and generates the output greater than signal GT_OUT and the output equality signal EQ_OUT by resolving the EQ and GT signals received from the single-bit comparison stage 310. By comparing individual bits of A with individual bits of B and subsequently resolving (e.g., logically combining) the results of the single-bit comparisons, no adder is required within the comparator circuit 300 to determine whether A>B, A<B, and/or A=B.

The single-bit comparison stage 310 has inputs to receive A[N:0] and B[N:0], and has outputs to generate single-bit equality signals ($EQ_0$ to EQN) and single-bit greater than signals ($GT_0$ to $GT_N$). Each of the single-bit equality signals ($EQ_0$ to EQN) is generated in response to whether a corresponding bit pair of A and B are equal, and each of the single-bit greater than signals ($GT_0$ to $GT_N$) is generated in response to whether a corresponding bit of A is greater than the corresponding bit of B. The signals $EQ_n$ and $GT_n$ are generated according to the following bitwise relationships:

$$EQ_n = A_n \cdot B_n + !A_n \cdot !B_n$$

$$GT_n = A_n \cdot !B_n$$

where n is an integer from 0 to N, inclusive.

The resolution stage 320 has inputs to receive the single-bit equality signals ($EQ_0$ to $EQ_N$) and the single-bit greater than signals ($GT_0$ to $GT_N$), and has outputs to generate EQ_OUT and GT_OUT. As explained in more detail below with respect to FIG. 5, resolution stage 320 includes a plurality of combinational logic circuits arranged in hierarchical levels that progressively combine increasing number of bits of the input signals A and B to generate the output signals EQ_OUT and GT_OUT.

As discussed above with respect to FIG. 2, comparator circuit 300 may include one or more combinational logic gates to generate A<B from A>B and A=B. In other embodiments, the comparator 300 may be configured to output LT_OUT and EQ_OUT, or LT_OUT and GT_OUT instead of EQ_OUT and GT_OUT.

Figure 4:
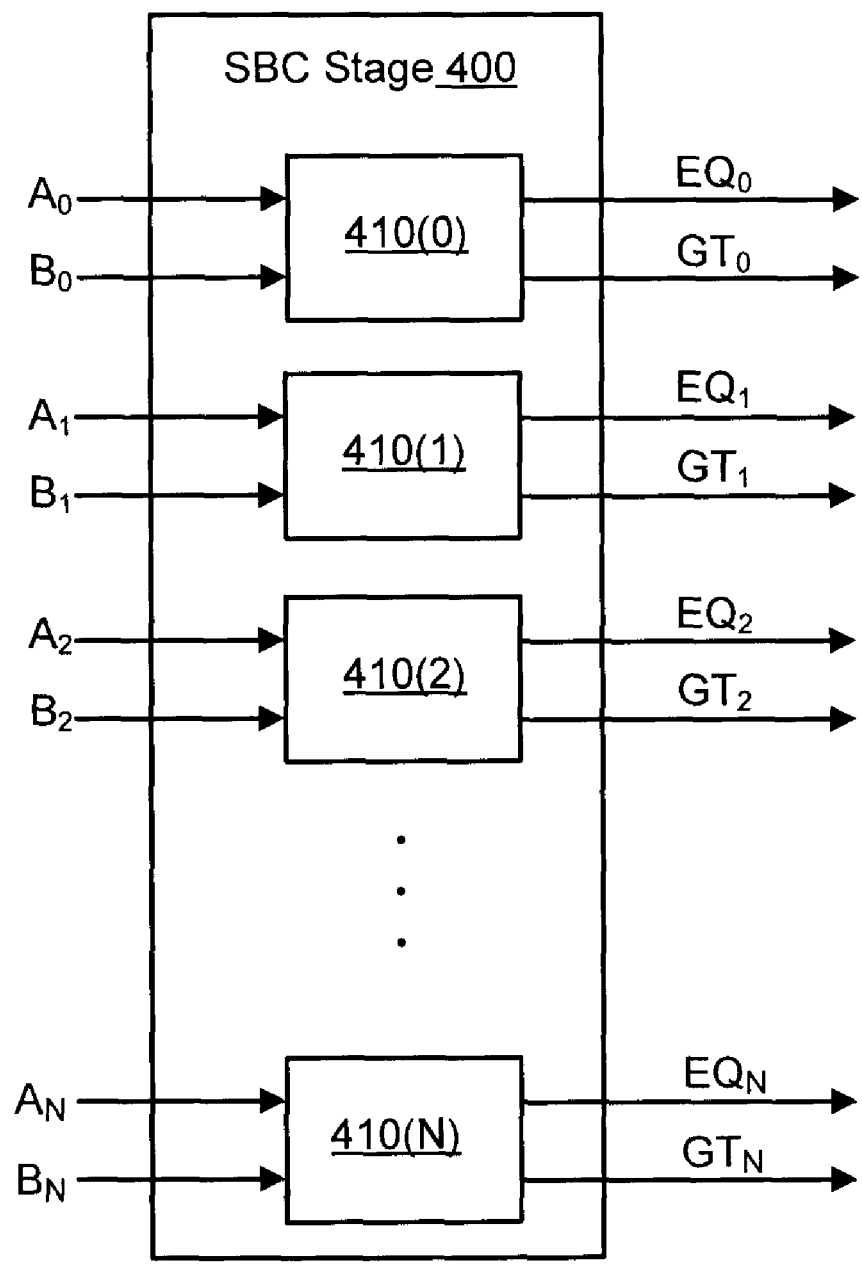
FIG. 4 is a functional block diagram illustrating an exemplary embodiment of the single-bit comparison stage of FIG. 2.

FIG. 4 is a block diagram of a single-bit comparison stage 400 that is one embodiment of the single-bit comparison stage 310 of FIG. 3. The single-bit comparison stage 400 includes N+1 single-bit comparators 410(0)-410(N). Each of the single-bit comparators 410(0)-410(N) receives a corresponding pair of bits of A and B and generates corresponding single-bit EQ and GT signals. For example, single-bit comparator 410(0) receives $A_0$ and $B_0$ and outputs $EQ_0$ and $GT_0$, single-bit comparator 410(1) receives $A_1$ and $B_1$ and outputs $EQ_1$ and $GT_1$, and so on. For some embodiments, each single-bit comparator 410 is a CMOS comparator circuit that implements the equations of $EQ_n$ and $GT_n$ described with respect to FIG. 3. For other embodiments, each single-bit comparator 410 is implemented using dynamic or domino logic, and receives a clock signal (not shown for simplicity in FIG. 4) from a clock generator, which may be external to the comparator.

Figure 5:
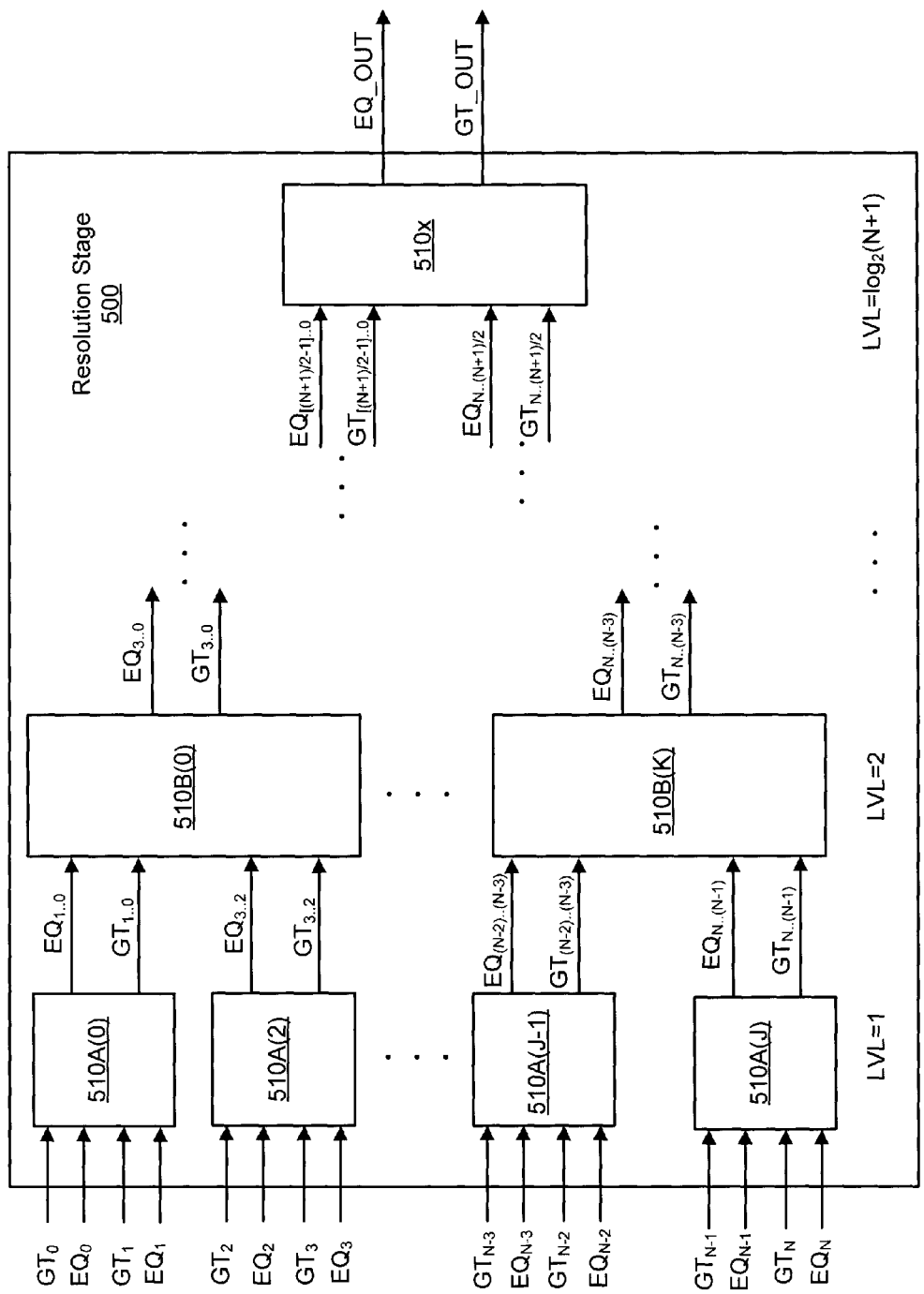
FIG. 5 is a functional block diagram illustrating an exemplary embodiment of the resolution stage of FIG. 2.

FIG. 5 is a functional block diagram a resolution stage 500 that is one embodiment of the resolution stage 320 of FIG. 3. The resolution stage 500 has inputs to receive N+1 single-bit equality signals ($EQ_0$ to $EQ_N$) and N+1 single-bit greater than signals ($GT_0$ to $GT_N$) generated by the single-bit comparison stage 310 of FIG. 3, and has outputs to generate EQ_OUT and GT_OUT. The resolution stage 500 includes a plurality of combination blocks 510, each of which is configured to logically combine a corresponding pair of GT input signals and a corresponding pair of EQ input signals to generate a pair of GT and EQ output signals. The combination blocks 510 are arranged in a number L of hierarchical levels LVL, where L=$\log_2$(N+1). The LVL=1 combination blocks 510A each receive corresponding pairs of single-bit GT and EQ signals from the single-bit comparison stage, and in response thereto generate a pair of multi-bit GT and EQ signals representing the corresponding pair of bits of A and B. For example, combination block 510A(0) receives $GT_0$, $GT_1$, $EQ_0$, and $EQ_1$, and generates signals $GT_{1...0}$ and $EQ_{1...0}$, where $GT_{1...0}$ indicates whether $A_1 A_0 > B_1 B_0$ and $EQ_{1...0}$ indicates whether $A_1 A_0 = B_1 B_0$. The LVL=2 combination blocks 510B each receive corresponding pairs of multi-bit GT and EQ signals from the LVL=1 combination blocks 510A, and in response thereto generate a pair of multi-bit GT and EQ signals representing the corresponding group of 4 bits of A and B. For example, combination block 510B(0) receives $GT_{1...0}$, $GT_{3...2}$, $EQ_{1...0}$ and $EQ_{3...2}$, and generates signals $GT_{3...0}$ and $EQ_{3...0}$, where $GT_{3...0}$ indicates whether $A_3 A_2 A_1 A_0 > B_3 B_2 B_1 B_0$ and $EQ_{3...0}$ indicates whether $A_3 A_2 A_1 A_0 = B_3 B_2 B_1 B_0$. This process continues in a hierarchical manner until the final output signals GT_OUT and EQ_OUT are generated by a single combination block 510x in the last level LVL=$\log_2$(N+1). Note that for each hierarchical level of the embodiment of FIG. 5, the GT and EQ signals generated by the combination block 510 in the level represents the logical combination of n=$2^{LVL}$ bits of the binary values A and B.

As noted above, a GT signal representing a subsequence of bits n to m of the binary values A and B is denoted as $GT_{n...m}$. Similarly, an EQ signal representing a subsequence of bits n to m of the binary values A and B is denoted as $EQ_{n...m}$. The logical relationship between $EQ_{n...m}$ and the single-bit EQ signals $EQ_m$ to $EQ_n$ can be expressed as:

$$EQ_{n...m} = EQ_n \cdot EQ_{n-1} \cdot \ldots \cdot EQ_{m+1} \cdot EQ_m.$$

Alternatively, $EQ_{n...m}$ may be expressed in terms of other multi-bit equality signals:

$$EQ_{n...m} = EQ_{n...(k+1)} \cdot EQ_{k...m},$$

where k is an integer and N≧n>k>m≧0. $GT_{n...m}$ is generated by one or more combination blocks from single-bit equality signals $EQ_m$ to $EQ_n$ and single-bit greater than signals $GT_m$ to $GT_n$. The overall greater than signal (A>B) may also be referred to as $GT_{N...0}$. The logical relationship to generate $GT_{n...m}$ can be expressed as:

$$GT_{n...m} = GT_n + GT_{n-1} \cdot EQ_n + GT_{n-2} \cdot EQ_{n...(n-1)} + \ldots + GT_m \cdot EQ_{n...m}.$$

$GT_{n...m}$ may also be expressed as:

$$GT_{n...m} = GT_{n...(k+1)} + GT_{k...m} \cdot EQ_{n...(k+1)},$$

where k is an integer and N≧n>k>m≧0. Thus, for example, the LVL=1 combination block 510A(2) generate $EQ_{3...2}$ and $GT_{3...2}$ based on the following relationships:

$$EQ_{3...2} = EQ_3 \cdot EQ_2$$

$$GT_{3...2} = GT_3 + GT_2 \cdot EQ_3.$$

Suppose that A[3:2] is the binary subsequence 11 and B[3:2] is the binary subsequence 10. Thus, the single-bit comparison stage 400 generates $EQ_3=1$, $EQ_2=0$, $GT_3=0$, and $GT_2=1$. Thus, $EQ_{3...2}$ and $GT_{3...2}$ are given by:

$$EQ_{3...2}=EQ_3 \cdot EQ_2=1 \cdot 0=0$$

$$GT_{3...2}=GT_3+GT_2 \cdot EQ_3=0+1 \cdot 1=1.$$

The LVL=2 combination block 510B(0) generates $EQ_{3...0}$ and $GT_{3...0}$ based on the following relationships:

$$EQ_{3...0}=EQ_{3...2} \cdot EQ_{1...0}$$

$$GT_{3...0}=GT_{3...2}+GT_{1...0} \cdot EQ_{3...2}.$$

Another example is illustrated below, assuming A[3:0]=1011 and B[3:0]=0110:

$$A_{3...0}=1011; B_{3...0}=0110$$

$$EQ_0=0; EQ_1=1; EQ_2=0; EQ_3=0$$

$$GT_0=1; GT_1=0; GT_2=0; GT_3=1$$

$$EQ_{1...0}=EQ_1 \cdot EQ_0=1 \cdot 0=0$$

$$EQ_{3...2}=EQ_3 \cdot EQ_2=0 \cdot 0=0$$

$$GT_{1...0}=GT_1+GT_0 \cdot EQ_1=0+1 \cdot 1=1$$

$$GT_{3...2}=GT_3+GT_2 \cdot EQ_3=1+0 \cdot 0=1$$

$$EQ_{3...0}=EQ_{3...2} \cdot EQ_{1...0}=0 \cdot 0=0$$

$$GT_{3...0}=GT_{3...2}+GT_{1...0} \cdot EQ_{3...2}=1+1 \cdot 0=1.$$

As mentioned above, for embodiments such as resolution stage 500 of FIG. 5 in which each combination block 510 combines two input GT and EQ signals to generate a pair of output GT and EQ signals, the number L of levels to generate EQ_OUT and GT_OUT for binary values having N+1 bits is $L=\log_2(N+1)$. Thus, for example, a resolution stage 500 for use in a full comparator circuit for comparing 16-bit binary values will have $L=\log_2(16)=4$ levels.

According to other embodiments, combination blocks 510 in the resolution stage 500 may be configured to receive more than two equality signals and more than two greater than signals. For example, some or all combination blocks in resolution stage 500 may be configured to receive four equality signals and four greater than signals.

Figure 6A:
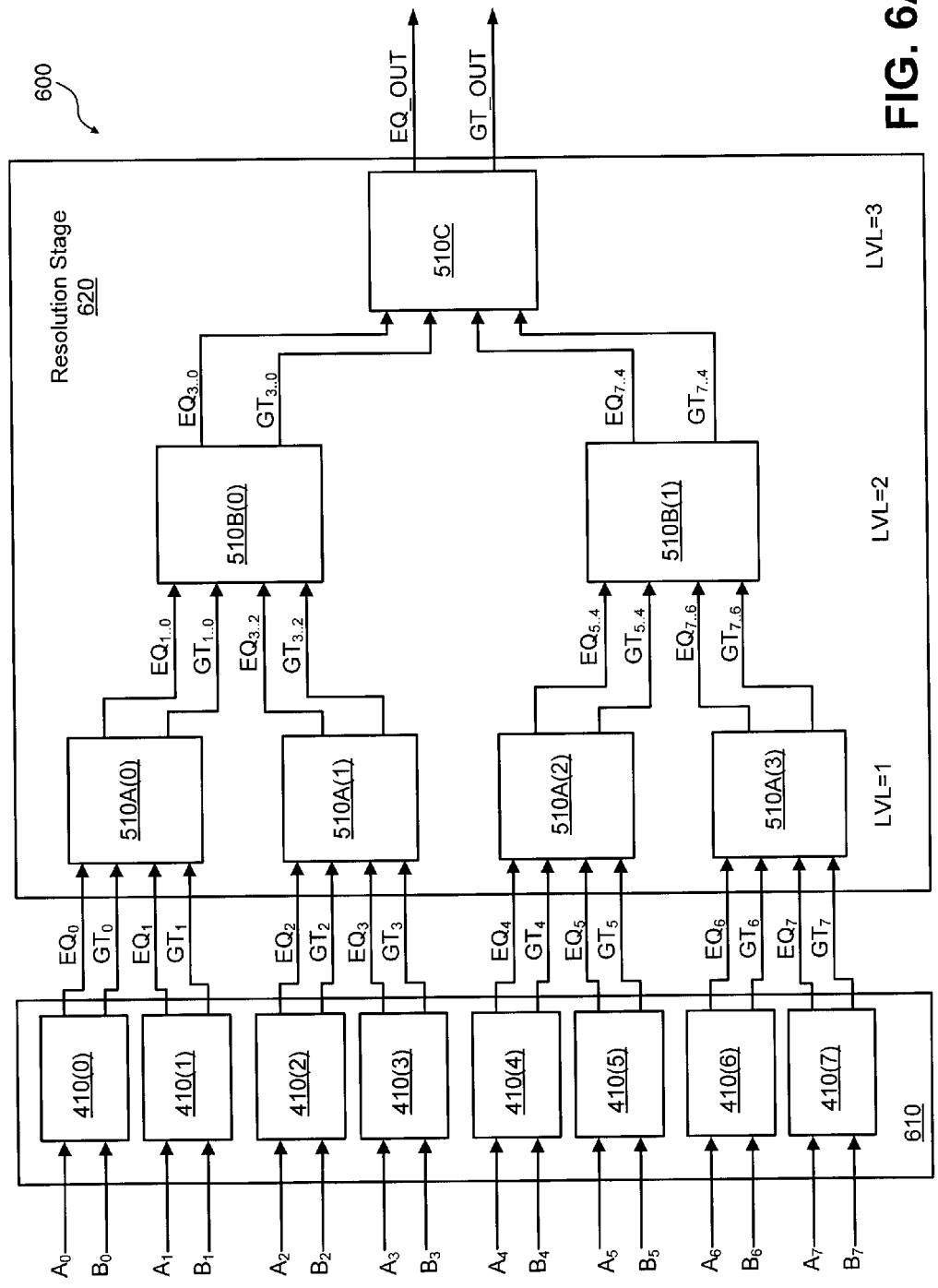
FIG. 6A is a functional block diagram illustrating an exemplary embodiment of a comparator circuit for comparing 8-bit binary values.

FIG. 6A is a functional block diagram of a comparator circuit 600 configured in accordance with first embodiments to generate GT and EQ signals for two 8-bit binary values A[7:0] and B[7:0]. Comparator 600 includes a single-bit comparison stage 610 and a resolution stage 620. The comparison stage 610 includes 8 single-bit comparators 410(0)-410(7). Each of the single-bit comparators 410(0)-410(7) receives a corresponding bit of A and of B, and generates a single-bit equality signal and a single-bit greater than signal. For example, single-bit comparator 410(1) receives $A_1$ and $B_1$ and generates $EQ_1$ and $GT_1$.

The resolution stage 620 includes $L=\log_2 8=3$ levels of combination blocks 510A, 510B, and 510C. Each of the LVL=1 combination blocks 510A(0)-510A(3) receives two single-bit equality signals and two single-bit greater than signals and generates a two-bit equality signal and a two-bit greater than signal. For example, combination block 510A(1) receives $EQ_3$, $EQ_2$, $GT_3$, and $GT_2$, and generates two-bit equality signal $EQ_{3...2}$ and two-bit greater than signal $GT_{3...2}$. Each of LVL=2 combination blocks 510B(0)-510B(1) receives 2 two-bit equality signals and 2 two-bit greater than signals to generate a four-bit equality signal and a four-bit greater than signal. For example, combination block 510B(0) receives $EQ_{1...0}$, $GT_{3...2}$, and $GT_{1...0}$, and $GT_{3...2}$, and generates four-bit equality signal $EQ_{3...0}$ and four-bit greater than signal $GT_{3...0}$. The LVL=3 combination block 510C receives $EQ_{7...4}$, $EQ_{3...0}$, $GT_{7...4}$, and $GT_{3...0}$, and generates output signals EQ_OUT and GT_OUT.

Figure 6B:
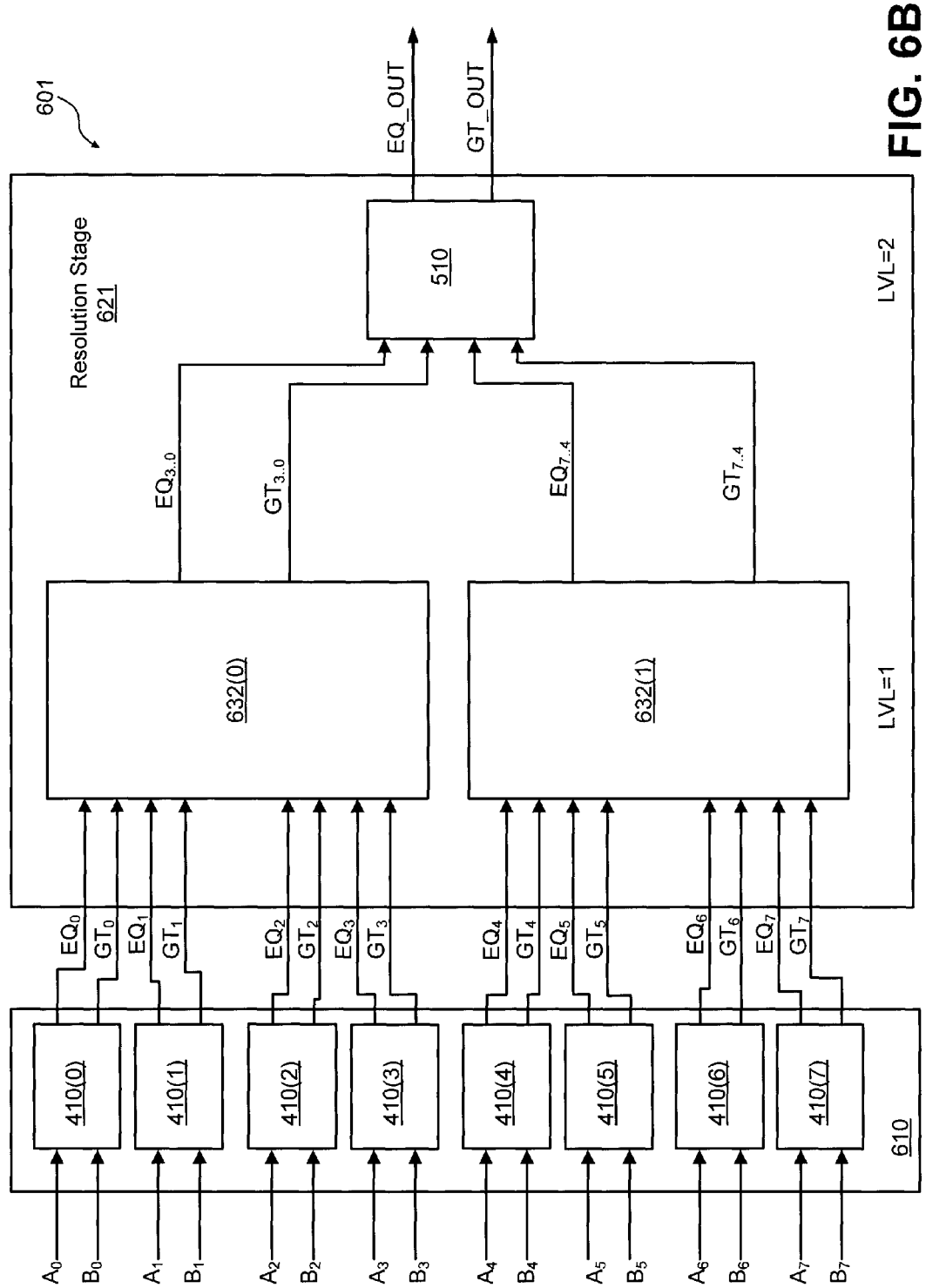
FIG. 6B is a functional block diagram illustrating another exemplary embodiment of a comparator circuit for comparing two 8-bit binary values.

FIG. 6B is a functional block diagram of a comparator circuit 601 configured in accordance with second embodiments to generate GT and EQ signals for two 8-bit binary values A[7:0] and B[7:0]. The embodiment shown in FIG. 6B is similar to the embodiment described with respect to FIG. 6A, with the exception that the resolution stage 621 of FIG. 6B includes combination blocks 632(0)-632(1) that each receive four equality signals and four greater than signals. For example, four-bit combination block 632(0) receives $EQ_0$, $EQ_1$, $EQ_2$, $EQ_3$, $GT_0$, $GT_1$, $GT_2$, and $GT_3$. Four-bit combination block 632(0) generates four-bit equality signal $EQ_{3...0}$, and four-bit greater than signal $GT_{3...2}$. The four-bit equality and greater than signals are transmitted to two-bit combination block 510, which generates the output signals EQ_OUT and GT_OUT. By utilizing four-bit combination blocks 632(0)-632(1), the resolution stage 621 only requires two levels of combination blocks to generate the signals EQ_OUT and GT_OUT.

Figure 7:
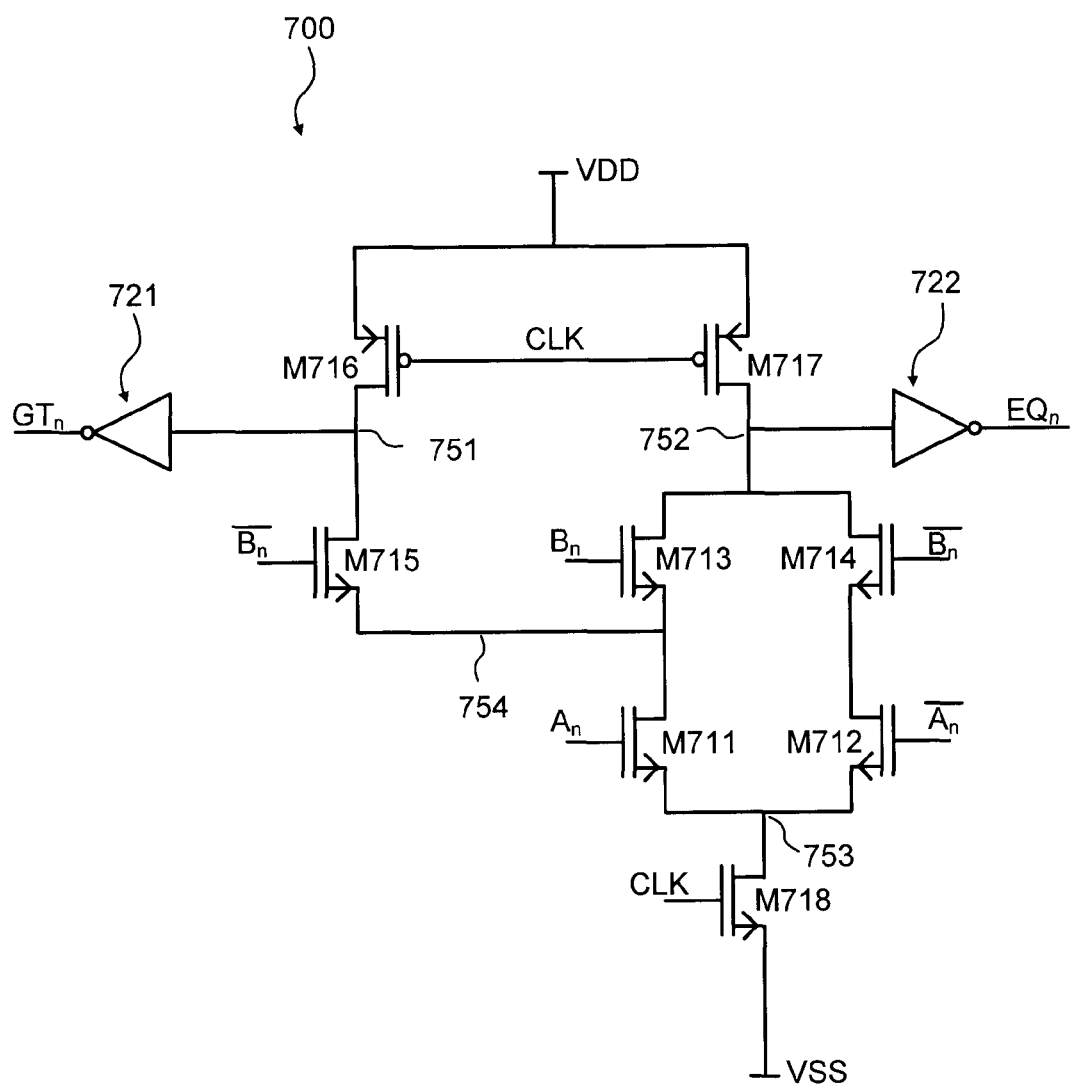
FIG. 7 is a circuit diagram illustrating an embodiment of the single-bit comparison stage of FIG. 3.

FIG. 7 is a schematic diagram of a single-bit comparator circuit 700 that is one embodiment of the single-bit comparator circuit 410 of FIG. 4. The single-bit comparator 700 has inputs to receive a single bit of A ($A_n$), a single bit of B ($B_n$), and a clock signal CLK. The single-bit comparator 700 has outputs to transmit a single-bit equality signal ($EQ_n$) and a single-bit greater than signal ($GT_n$). Single-bit comparator 700 includes a plurality of transistors M711-M718 and inverters 722-723. Other inverters (not shown for simplicity) may be included in single-bit comparator 700 to generate $!A_n$ and $!B_n$ from the input signals $A_n$ and $B_n$, respectively.

PMOS transistor M716 is connected between a first voltage supply VDD and a first node 751, and PMOS transistor M717 is connected between VDD and a second node 752. The gates of PMOS transistors M716 and M717 receive a clock signal CLK, and in response thereto, selectively pre-charge respective nodes 751 and 752. For example, when CLK is in a logic low state, PMOS transistors M717 and M716 turn on and pull up respective nodes 751 and 752 high towards VDD. Conversely, when CLK is in a logic high state, PMOS transistors M717 and M716 turn off and isolate respective nodes 751 and 752 from VDD.

NMOS transistor M718 is connected between a third node 753 and a second voltage supply VSS, which for some embodiments can be ground potential. The gate of NMOS transistor M718 is coupled to CLK, which selectively turns on transistor M718 to discharge node 753 (e.g., toward ground potential). For example, when CLK is in a logic high state, NMOS transistor M718 turns on and pulls node 753 low towards VSS. Conversely, when CLK is in a logic low state, NMOS transistor M718 turns off and isolates node 753 from VSS.

NMOS transistors M712 and M714 are connected in series between nodes 752 and 753. The gate of NMOS transistor M712 is coupled to $!A_n$, and the gate of NMOS transistor M714 is coupled to $!B_n$. NMOS transistors M711 and M713 are connected in series between nodes 752 and 753. The gate of NMOS transistor M711 is coupled to $A_n$, and the gate of NMOS transistor is coupled to $B_n$. An NMOS transistor M715 is connected between nodes 751 and 754, and has gate coupled to $!B_n$. Inverter 721 logically complements the signal at node 751 to generate $GT_n$, and inverter 722 logically complements the signal at node 721 to generate $EQ_n$.

When CLK is in a de-asserted logic low state, NMOS transistor M718 turns off and isolates node 753 from VSS, and PMOS transistors M716 and M717 turn on and pull nodes 751 and 752 to a logic high level (e.g., toward VDD), thereby forcing inverter 721 to drive $GT_n$ to a logic low state and forcing inverter 722 to drive $EQ_n$ to a logic low state. When CLK transitions to an asserted logic high state, PMOS transistors M716 and M717 turn off, and NMOS transistor M718 turns on to open a current path between node 753 and VSS, thereby enabling circuit 700 to generate $EQ_n$ and $GT_n$ in response to $A_n$ and $B_n$ according to the following Boolean equations:

$$EQ_n = A_n \cdot B_n + !A_n \cdot !B_n$$

$$GT_n = A_n \cdot !B_n.$$

Although not shown in FIG. 7 for simplicity, circuit 700 may include additional transistors to prevent nodes 751 and 752 from floating when CLK is asserted to logic high and there is not a current path to VSS. Further, while certain embodiments allow for the single-bit comparator 700 to be implemented as a dynamic circuit timed by a clock signal, according to other embodiments the single-bit comparator 700 can be implemented as static logic circuits.

Figure 8:
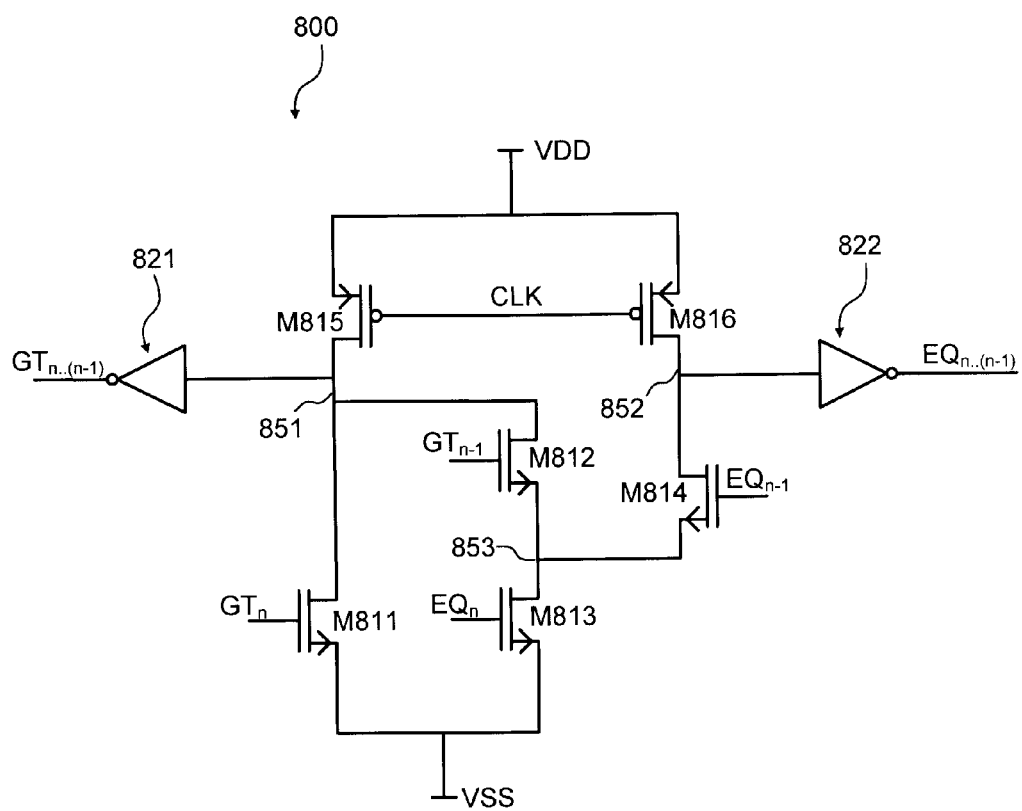
FIG. 8 is a circuit diagram illustrating an embodiment of the two-bit resolution stage of FIG. 6A.

FIG. 8 is a schematic diagram of a combination block 800 that is one embodiment of the combination block 510 of FIG. 5. The combination block 800 has inputs to receive two equality signals $EQ_n$, $EQ_{n-1}$, two greater than signals $GT_n$, $GT_{n-1}$, and a clock signal CLK. The combination block 800 has outputs to generate output signals $GT_{n\ldots(n-1)}$ and $EQ_{n\ldots(n-1)}$.

A PMOS transistor M815 is connected between VDD and a first node 851, and a PMOS transistor M816 is connected between VDD and a second node 852. The gates of PMOS transistors M815 and M816 receive the clock signal CLK. The PMOS transistors M815 and M816 charge respective nodes 851 and 852 to logic high (e.g., to VDD) when the clock signal CLK is in a logic low state, and isolate respective nodes 851 and 852 from VDD when CLK is in a logic high state.

An NMOS transistor M811 is connected between node 851 and VSS, and has a gate coupled to $GT_n$. An NMOS transistor M812 is connected between nodes 851 and 853, and has a gate coupled to $GT_{n-1}$. An NMOS transistor M813 is connected between node 853 and VSS, and has a gate coupled to $EQ_n$. An NMOS transistor M814 is connected between nodes 852 and 853, and has gate coupled to $EQ_{n-1}$. An inverter 821 logically complements the signal at node 851 to generate output signal $GT_{n\ldots(n-1)}$, and an inverter 822 logically complements the signal at node 852 to generate the output signal $EQ_{n\ldots(n-1)}$.

In contrast to the single-bit comparator 700 of FIG. 7, combination block 800 does not require a foot transistor controlled by the clock signal CLK because the GT and EQ signals cannot be logic high if CLK is not asserted. However, if combination block 800 is implemented as a static logic circuit, then a footer transistor similar to NMOS transistor M718 of FIG. 7 is included.

When CLK is in a de-asserted logic low state, PMOS transistors M815 and M816 turn on and pull nodes 851 and 852 to a logic high level (e.g., toward VDD), thereby forcing inverter 821 to drive $GT_{n\ldots(n-1)}$ to a logic low state and forcing inverter 822 to drive $EQ_{n\ldots(n-1)}$ to a logic low state. When CLK transitions to an asserted logic high state, PMOS transistors M815 and M816 turn off, thereby enabling circuit 800 to generate $EQ_{n\ldots(n-1)}$ and $GT_{n\ldots(n-1)}$ in response to $GT_n$, $EQ_n$, and $EQ_{n-1}$ according to the following Boolean equations:

$$EQ_{n\ldots(n-1)} = EQ_n \cdot EQ_{n-1}$$

$$GT_{n\ldots(n-1)} = GT_n + GT_{n-1} \cdot EQ_{n-1}.$$

Figure 9:
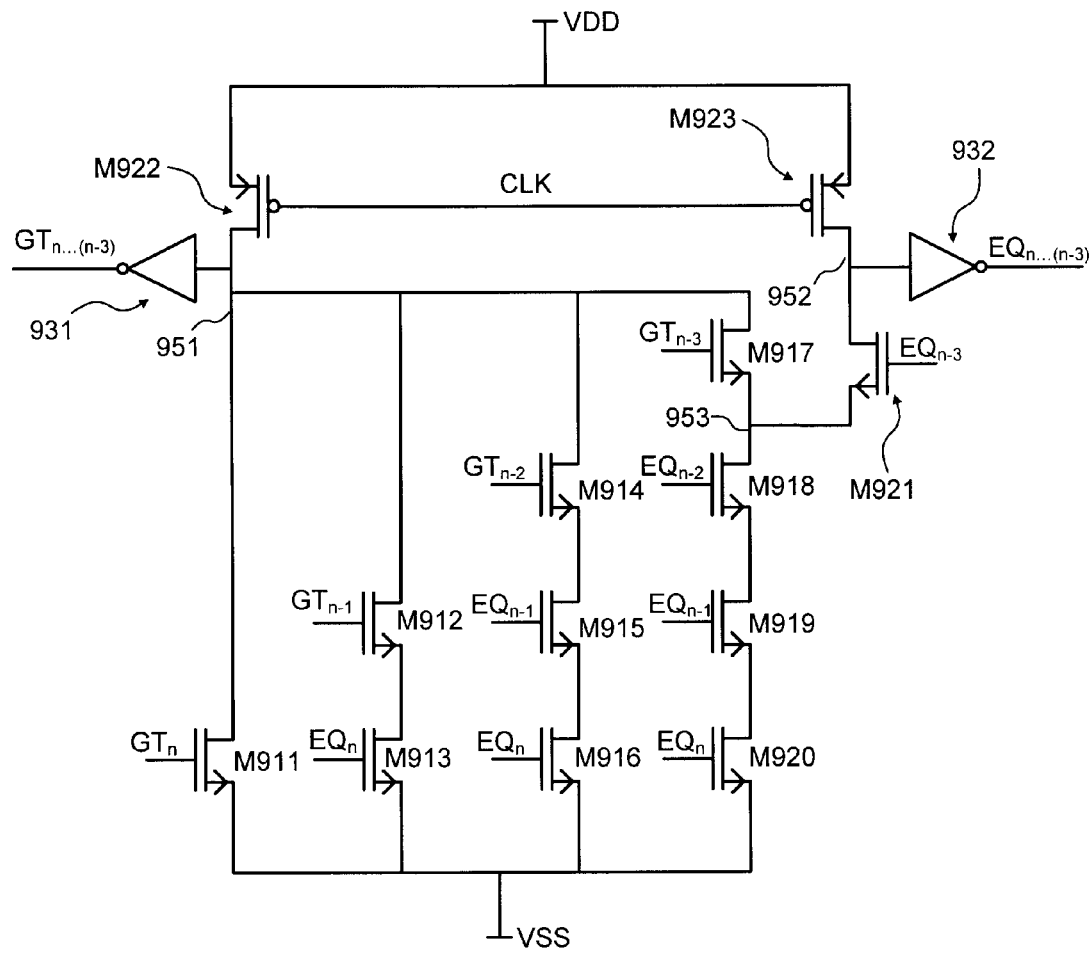
FIG. 9 is a circuit diagram illustrating an embodiment of the four-bit resolution stage of FIG. 6B.

FIG. 9 is a schematic diagram of a combination block 900 that is one embodiment of the combination blocks 632 of FIG. 6B. The combination block 800 has inputs to receive four equality signals $EQ_n$, $EQ_{n-1}$, $EQ_{n-2}$, $EQ_{n-3}$, four greater than signals $GT_n$, $GT_{n-1}$, $GT_{n-2}$, $GT_{n-3}$, and a clock signal CLK. The combination block 800 has outputs to transmit output signals $GT_{n\ldots(n-3)}$ and $EQ_{n\ldots(n-3)}$.

A PMOS transistor M922 is connected between VDD and a node 951, and a PMOS transistor M923 is connected between VDD and a node 952. The gates of the PMOS transistors M922 and M923 receive the clock signal CLK. The PMOS transistors M922 and M923 charge respective nodes 951 and 952 to logic high (e.g., to VDD) when the clock signal CLK is logic low.

An NMOS transistor M911 is connected between node 951 and VSS. NMOS transistors M912 and M913 are connected in series between node 951 and VSS. The gates of NMOS transistors M911, M912, and M913 are coupled to signals $GT_n$, $GT_{n-1}$, and $EQ_n$, respectively. NMOS transistors M914, M915, and M916 are connected in series between node 951 and VSS. The gates of NMOS transistors M914, M915, and M916 are coupled to signals $GT_{n-2}$, $EQ_{n-1}$, and $EQ_n$, respectively. An NMOS transistor M917 is connected between nodes 951 and 953, and has a gate coupled to signal $GT_{n-3}$. NMOS transistors M918, M919, and M920 are connected in series between the node 953 and the negative supply VSS. The gates of NMOS transistors M918, M919, and M920 are coupled to signals $EQ_{n-2}$, $EQ_{n-1}$, and $EQ_n$, respectively. An NMOS transistor 921 is connected between nodes 952 and 953, and has a gate coupled to signal $EQ_{n-3}$. An inverter 931 has an input coupled to node 951 and outputs the signal $GT_{n\ldots(n-3)}$. An inverter 932 has an input coupled to node 952 and outputs the signal $EQ_{n\ldots(n-3)}$.

Figure 10:
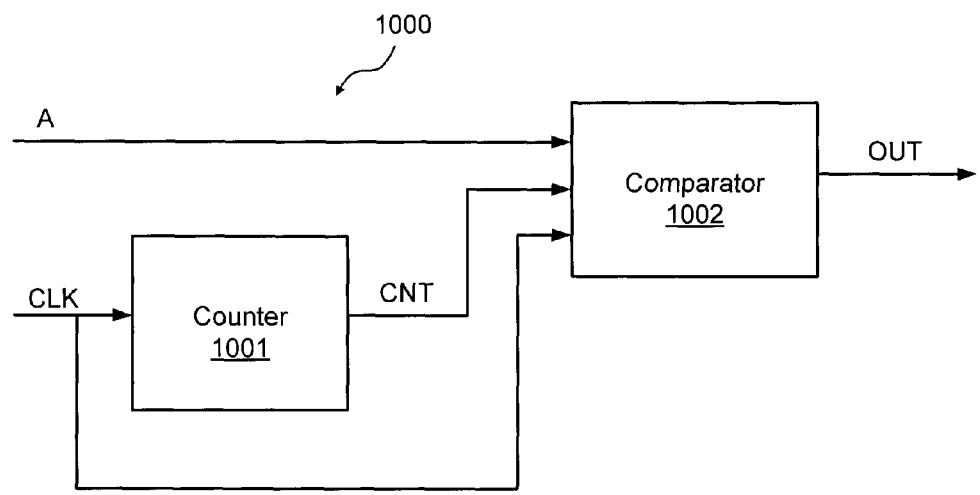
FIG. 10 shows an embodiment of a counter-comparator circuit.

FIG. 10 is a functional block of a counter-comparator circuit 1000 in accordance with present embodiments. The counter-comparator circuit 1000 includes a counter 1001 and a comparator circuit 1002. The counter-comparator circuit 1000 may be used in applications in which an output signal OUT is asserted (or alternatively de-asserted) after a certain number of cycles of a clock or a trigger signal. Counter 1001, which can be any well-known counter circuit, has an input to receive a clock signal CLK, and has an output to generate a count value CNT. Counter 1001 may increment the value of CNT every clock cycle or every $n^{th}$ clock cycle, and may be reset to zero or another pre-determined value via the assertion of a reset input (not shown for simplicity) to the counter 1001. Unless the reset input is asserted, CNT is a monotonically changing (incrementing or decrementing) value. The comparator circuit 1002 has inputs to receive CNT, an operand (A), and CLK. The comparator circuit 1002 compares A with CNT whenever CLK is in a certain state (e.g., in a logic high or low state), and outputs the result of the comparison as output signal OUT.

According to some embodiments, CNT is a monotonically increasing count value, A is held constant during operations of the counter-comparator circuit 1000, and OUT corresponds to a greater than or equal to signal that is asserted when CNT is greater than or equal to A. Since CNT is a monotonically increasing value, comparator circuit 1002 may be configured to assert OUT (e.g., to logic high) when A is equal to CNT. Thereafter, on subsequent cycles of CLK, comparator circuit 1002 may be configured to simply maintain the state of OUT because CNT will only increase in subsequent clock cycles. This configuration of the comparator 1002 simplifies the comparison operation that is performed between CNT and A during every cycle of CLK.

According to other embodiments, CNT is a monotonically decreasing value, and OUT corresponds to a less than or equal to signal that is asserted when CNT is less than or equal to A.

Figure 11:
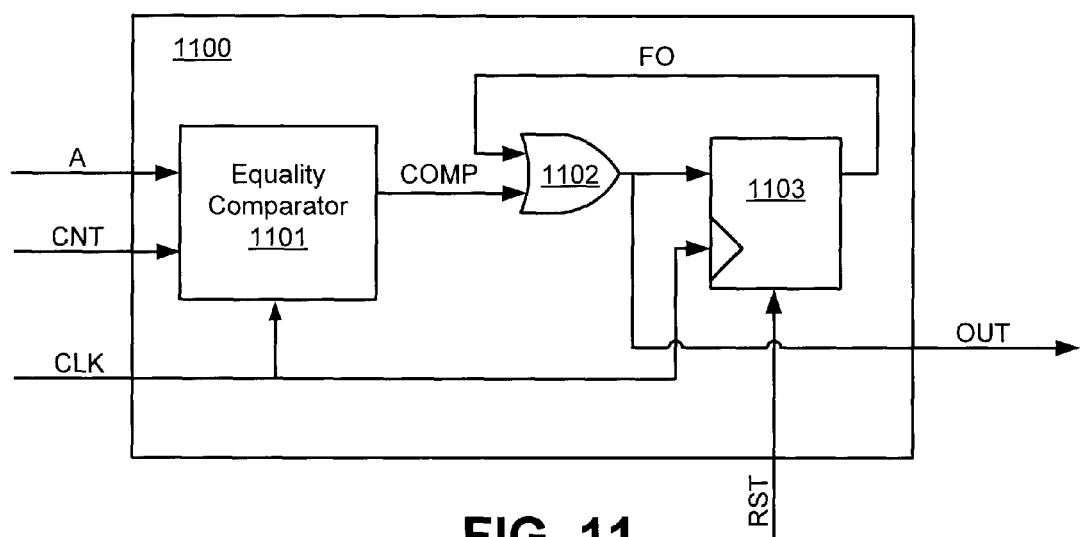
FIG. 11 is a functional block diagram illustrating an exemplary embodiment of the counter-comparator circuit of FIG. 10.

FIG. 11 is a functional block diagram of a comparator circuit 1100 that is one embodiment of the comparator circuit 1002 of FIG. 10. Comparator 1100 has inputs to receive the operand A, a monotonically increasing count value CNT, a reset signal (RST), and a clock signal CLK. The operand A is held stable during operations of the comparator 1100. The comparator 1100 has an output to transmit the result of the comparison between A and CNT as an output signal OUT. The comparator 1100 is configured to perform a comparison between CNT and A without full comparators or adders, which are complicated and require large layout areas.

The comparator 1100 includes an equality comparator 1101, an OR gate 1102, and a flip-flop or latch 1103. The equality comparator 1101 has inputs to receive A, CNT, and CLK, and performs a comparison between CNT and A when CLK is in an asserted state to generate a comparison result signal COMP. The result signal COMP is asserted by the equality comparator 1101 when CNT is equal to A. COMP is transmitted to a first input of OR gate 1102, which has a second input to receive a flip-flop output signal FO from the flip-flop 1103. The OR gate 1102 transmits the signal OUT to the flip-flop 1103 and as the output signal of the comparator 1100. In addition to receiving OUT, flip-flop 1103 also receives the reset signal RST for resetting FO to zero.

The comparator 1100 is configured to perform a greater than or equal to comparison between A and CNT by setting the flip-flop output signal FO to an asserted state when A=CNT. For other embodiments, the comparator 1100 is configured to perform a less than or equal to comparison between A and a monotonically decreasing value by setting the flip-flop output signal FO to an asserted state when the operand and the monotonically changing value are determined to be equal. Assertion of FO causes OR gate 1102 to assert OUT. During subsequent clock cycles, the state of flip-flop 1103 is maintained (unless the reset signal RST is asserted) and the output of the comparator 1100 remains asserted. This behavior is desired because once the monotonically changing value is equal to the operand, all following cycles of the comparison yield the same result.

Figure 12A:
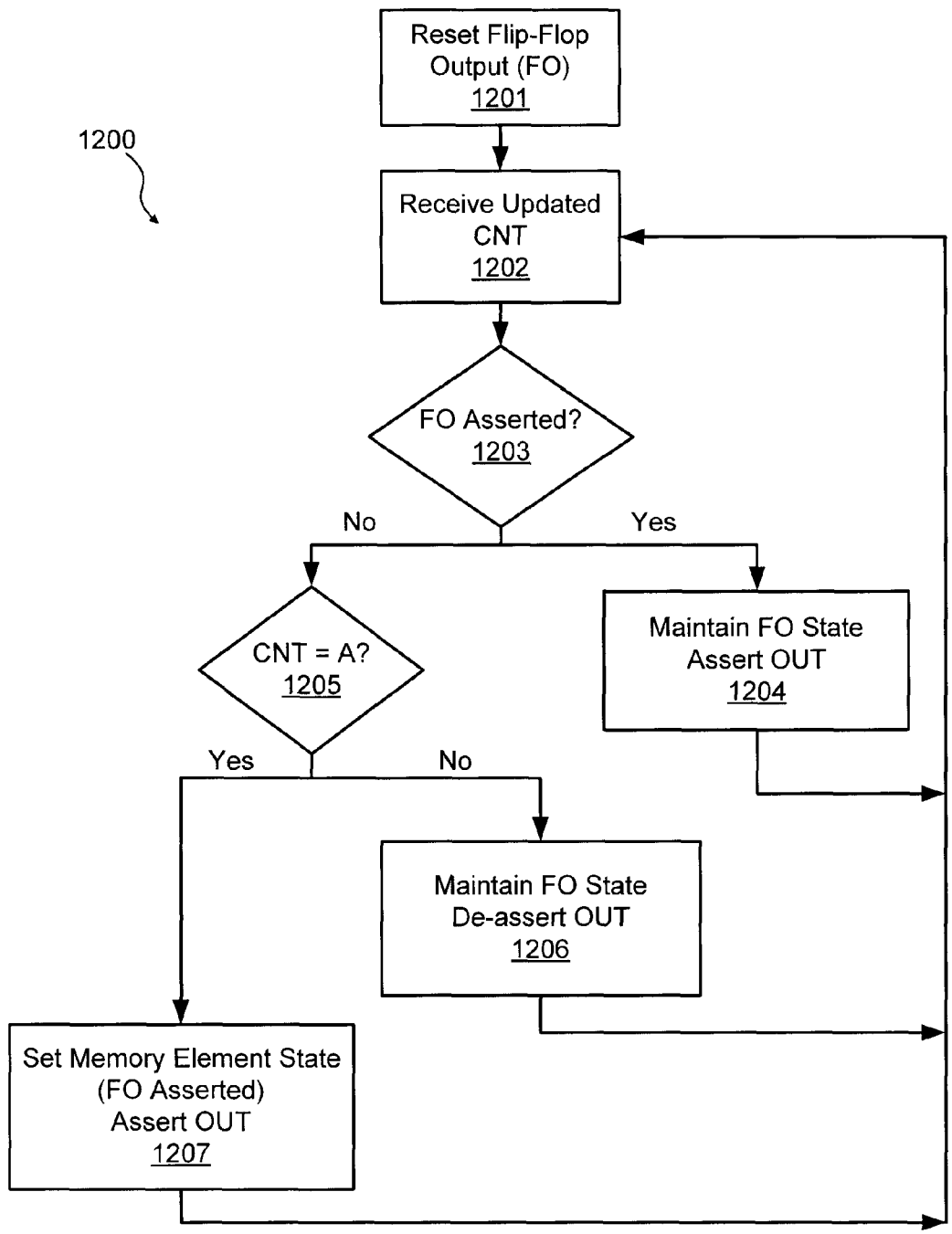
FIG. 12A is a flow chart illustrating an exemplary operation of an embodiment of the counter-comparator circuit of FIG. 11.

FIG. 12A is a flow chart illustrating an exemplary operation of an embodiment of the comparator 1100 shown in FIG. 12 in which comparator 1100 compares an input operand (A) with a monotonically changing value (CNT) that is updated periodically. At 1201, the flip-flop output signal FO is reset (e.g., to logic low). The flip-flop 1103 may be reset at any time, which causes operation of the comparator to return to 1201. The flip-flop 1103 may be reset by asserting the input signal RST. After flip-flop 1103 is reset, the signal FO is de-asserted to logical state 0. At 1202, CNT is updated. According to some embodiments, CNT is updated by a well-known counter circuit. If FO is in an asserted state, as tested at 1203, the state of the flip-flop 1103 is maintained (i.e., FO remains asserted) and OUT is asserted (or remains asserted) at 1204, and processing continues at 1202. Referring also to FIG. 11, if FO is asserted, OR gate 1102 asserts OUT, regardless of the value of COMP. Thus, the output of the comparator 1100 is asserted and the results of the equality comparator 1101 are bypassed. The asserted output value is also written to flip-flop 1103, which causes FO to remain in an asserted state.

If FO is in a de-asserted state, as tested at 1203, CNT and A are compared at 1205. If CNT and A are determined to be unequal at step 1205, FO is maintained in a de-asserted state and OUT is de-asserted or maintained in a de-asserted state. Subsequently, processing continues at 1202. If CNT and A are determined to be equal at 1205, an asserted signal is written to the flip-flop 1103 at 1207, and the output signal OUT is asserted, which in turn causes flip-flop 1103 to assert FO. Thereafter, processing continues at 1202 to receive an updated CNT value. Referring also to FIG. 11, if FO is in a de-asserted state, the output of the equality comparator 1101 determines the output of the OR gate (OUT). If CNT=A, COMP is asserted by the equality comparator 1101 and the OR gate 1102 asserts OUT and an asserted value is written to the flip-flop 1203 (i.e. FO is asserted after a short delay). If CNT≠A, COMP is de-asserted by the equality comparator 1101. As a result, OUT and FO remain in de-asserted states.

Figure 12B:
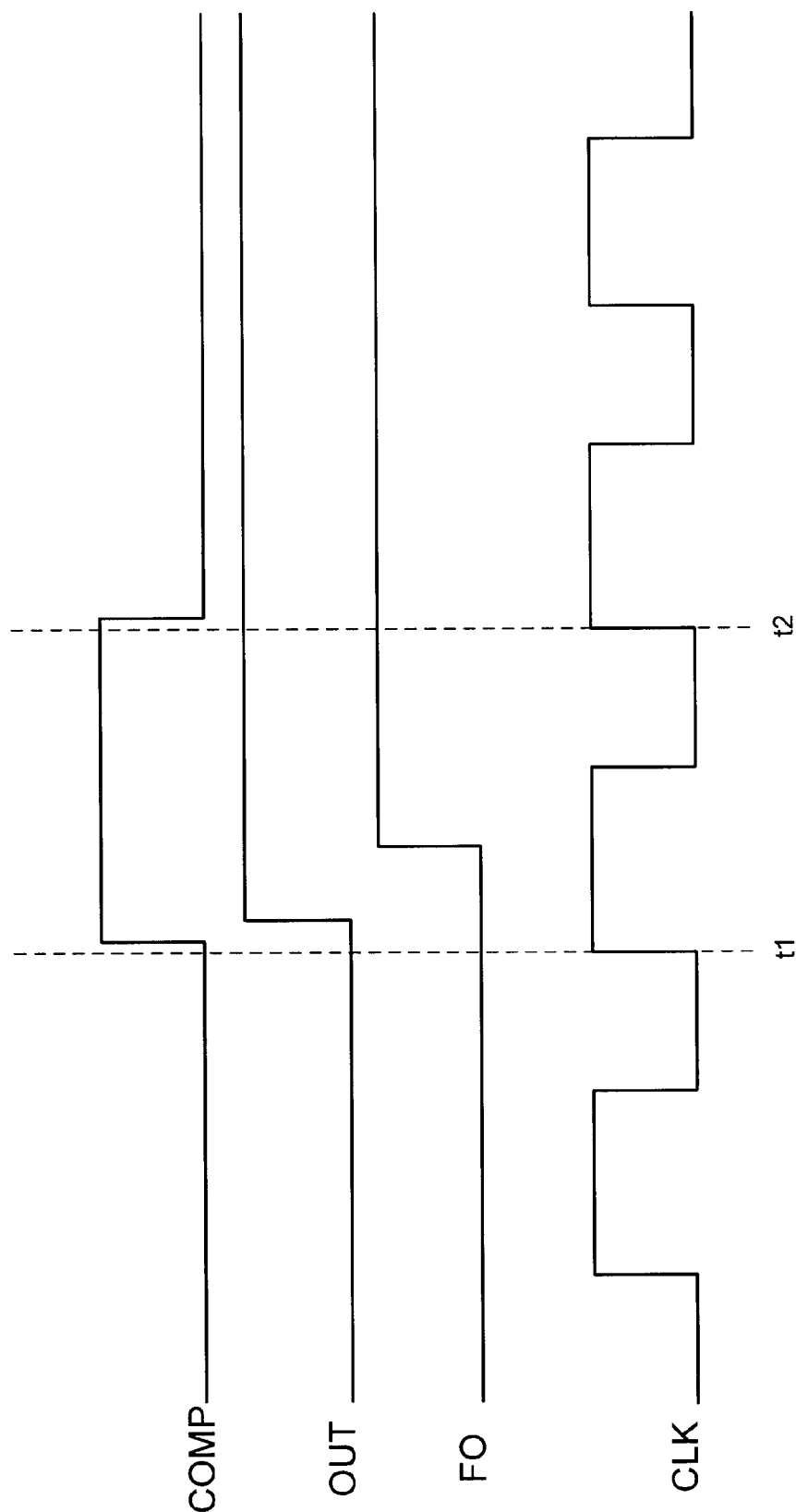
FIG. 12B is a timing diagram illustrating operation of the embodiment of the counter-comparator circuit of FIG. 11.

FIG. 12B is a timing diagram illustrating the operation of an embodiment of the comparator 1100 of FIG. 11. As discussed above, comparator 1100 has inputs to receive A, CNT, and CLK, where A is an operand that is held constant during the operation of the comparator, CNT is a monotonically increasing count value, and CLK is a clock or trigger signal. According to one embodiment, CNT is generated by a counter circuit that receives CLK as a timing signal.

Before time t1, CNT is less than A. As a result, the output of the equality comparator 1101 (COMP) is de-asserted. The flip-flop 1103 is reset at the beginning of the comparator operation, causing its output signal FO to be de-asserted before time t1. At time t1, CLK is asserted, and CNT is incremented to be equal to A. After a short delay after time t1 (e.g., corresponding to the delay of the equality comparator 1101), COMP is asserted. Subsequently, OR gate 1102 asserts OUT, which is transmitted as an output signal of the comparator 1100 and also transmitted to flip-flop 1103. After a short delay (e.g., corresponding to the setup time of flip-flop 1103) following receiving OUT, the flip-flop 1103 asserts FO. Then, COMP, FO, and OUT remain asserted for the remainder of the period of the CLK signal.

At time t2, the beginning of the subsequent period of the CLK signal, CNT is again incremented and causes CNT to be greater than A. As a result, the equality comparator 1101 de-asserts COMP a short delay after time t2. The OR gate 1102 continues to assert OUT because at least FO remains asserted. The asserted OUT signal is output from the comparator 1100 and is also transmitted to flip-flop 1103, which maintains FO in the asserted state. For all subsequent periods of the CLK signal, FO and OUT remain asserted.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A comparator circuit for comparing first and second binary numbers A and B each having a number N of bits, comprising:
   a single-bit comparison stage having a plurality of input pairs each for receiving a corresponding bit $A_n$ of the first binary number and a corresponding bit $B_n$ of the second binary number, having a plurality of first outputs each for generating a corresponding single-bit equality signal EQ$_n$, and having a plurality of second outputs each for generating a corresponding single-bit greater than signal GT$_n$; and a resolution stage having a plurality of first inputs to receive the single-bit equality signals, a plurality of second inputs to receive the single-bit greater than signals, having a first output to generate an output equality signal EQ$_{OUT}$ indicating whether the first binary number is equal to the second binary number, and having a second output to generate an output greater than signal GT$_{OUT}$ indicating whether the first binary number is greater than the second binary number, wherein the single bit comparison stage comprises:

a first PMOS transistor coupled between a voltage supply and a first output node and having a gate to receive a clock signal;

a second PMOS transistor coupled between the voltage supply and a second output node and having a gate to receive the clock signal;

first and second NMOS transistors coupled in series between the first output node and a discharge node and having gates to receive the corresponding bits A$_n$ and B$_n$;

third and fourth NMOS transistors coupled in series between the first output node and the discharge node and having gates to receive the corresponding bits !A$_n$ and !B$_n$; and a fifth NMOS transistor coupled between the second output node and an intermediate node between the first and second NMOS transistors having a gate to receive !B$_n$.

2. The comparator circuit of claim 1, wherein the comparator circuit does not include a binary adder.

3. The comparator circuit of claim 1, wherein the single-bit comparison stage comprises:

a plurality of single-bit comparators, each having inputs to receive a corresponding pair of single bits of the first and second binary numbers and having outputs to generate the single-bit equality and single-bit greater than signals.

4. The comparator circuit of claim 1, wherein the single-bit greater than signal GT$_n$ is expressed as GT$_n$=A$_n$·!B$_n$, and the single-bit equality signal EQ$_n$ is expressed as EQ$_n$=A$_n$·B$_n$+!A$_n$·!B$_n$.

5. The comparator circuit of claim 1, wherein the first output node generates EQ$_n$ indicating whether A$_n$=B$_n$, and the second output node generates GT$_n$ indicating whether A$_n$>B$_n$.

6. The comparator circuit of claim 1, wherein the single-bit comparison stage further comprises:

a sixth NMOS transistor coupled between the discharge node and ground potential and having a gate to receive the clock signal A$_n$.

7. The comparator circuit of claim 1, wherein the resolution stage comprises:

a multitude of combination blocks arranged in L=log$_2$N hierarchical levels, wherein the combination blocks in each hierarchical level logically combine the equality and greater than signals generated by a plurality of combination blocks in a previous hierarchical level.

8. A comparator circuit for comparing first and second binary numbers A and B each having a number N of bits, comprising:

a single-bit comparison stage having a plurality of input pairs each for receiving a corresponding bit A$_n$ of the first binary number and a corresponding bit B$_n$ of the second binary number, having a plurality of first outputs each for generating a corresponding single-bit equality signal EQ$_n$, and having a plurality of second outputs each for generating a corresponding single-bit greater than signal GT$_n$; and a resolution stage having a plurality of first inputs to receive the single-bit equality signals, a plurality of second inputs to receive the single-bit greater than signals, having a first output to generate an output equality signal EQ$_{OUT}$ indicating whether the first binary number is equal to the second binary number, and having a second output to generate an output greater than signal GT$_{OUT}$ indicating whether the first binary number is greater than the second binary number, wherein the resolution stage comprises a multitude of combination blocks arranged in L=log$_2$N hierarchical levels, wherein:

each combination block in a first hierarchical level is configured to logically combine a corresponding pair of the single-bit equality signals to generate a multi-bit equality signal and to logically combine a corresponding pair of the single-bit greater than signals to generate a multi-bit greater than signal; and each combination block in a subsequent hierarchical level is configured to logically combine a corresponding pair of the multi-bit equality signals from a previous hierarchical level and to logically combine a corresponding pair of the single-bit greater than signals from the previous hierarchical level.

9. The comparator circuit of claim 8, wherein GT$_n$=A$_n$·!B$_n$, EQ$_n$=A$_n$·B$_n$+!A$_n$·!B$_n$, and the multi-bit greater than signal GT$_{y\ldots x}$ representing A$_y$A$_x$ and B$_y$B$_x$ is GT$_{y\ldots x}$=GT$_y$+GT$_x$·EQ$_y$.

10. A comparator circuit for comparing first and second binary numbers A and B each having a number N of bits, comprising:

a single-bit comparison stage having a plurality of inputs pairs each for receiving a corresponding bit A$_n$ of the first binary number and a corresponding bit B$_n$ of the second binary number, having a plurality of first outputs each for generating a corresponding single-bit equality signal EQ$_n$=A$_n$·B$_n$+!A$_n$·!B$_n$, and having a plurality of second outputs each for generating a corresponding single-bit greater than signal GT$_n$=A$_n$·!B$_n$; and a resolution stage configured to logically combine the single-bit equality signals and the single-bit greater than signals in a plurality of combination blocks arranged in a number L=log$_2$N of hierarchical levels to generate an output equality signal EQ$_{OUT}$ indicating whether the first binary number is equal to the second binary number and to generate an output greater than signal GT$_{OUT}$ indicating whether the first binary number is greater than the second binary number, wherein the single-bit comparison stage includes a plurality of single-bit comparators, each comprising:

a first PMOS transistor coupled between a voltage supply and a first output node and having a gate to receive a clock signal;

a second PMOS transistor coupled between the voltage supply and a second output node and having a gate to receive the clock signal;

first and second NMOS transistors coupled in series between the first output node and a discharge node and having gates to receive the corresponding bits A$_n$ and B$_n$;

third and fourth NMOS transistors coupled in series between the first output node and the discharge node and having gates to receive the corresponding bits !A$_n$ and !B$_n$; and a fifth NMOS transistor coupled between the second output node and an intermediate node between the first and second NMOS transistors having a gate to receive $!B_n$.

11. The comparator circuit of claim 10, wherein the first output node generates $EQ_n$ indicating whether $A_n=B_n$, and the second output node generates $GT_n$ indicating whether $A_n>B_n$.

12. The comparator circuit of claim 10, wherein the single-bit comparison stage further comprises:
   a sixth NMOS transistor coupled between the discharge node and ground potential and having a gate to receive the clock signal $A_n$.

13. The comparator circuit of claim 10, wherein the combination blocks in each hierarchical level logically combine the equality and greater than signals generated by a plurality of combination blocks in a previous hierarchical level.

14. The comparator circuit of claim 10, wherein each combination block in a first hierarchical level is configured to logically combine a corresponding pair of the single-bit equality signals to generate a multi-bit equality signal and to logically combine a corresponding pair of the single-bit greater than signals to generate a multi-bit greater than signal, and each combination block in a subsequent hierarchical level is configured to logically combine a corresponding pair of the multi-bit equality signals from a previous hierarchical level and to logically combine a corresponding pair of the single-bit greater than signals from the previous hierarchical level.

15. The comparator circuit of claim 14, wherein $GT_n=A_n \cdot !B_n$, $EQ_n=A_n \cdot B_n + !A_n \cdot !B_n$, and the multi-bit greater than signal $GT_{y \ldots x}$ representing $A_y A_x$ and $B_y B_x$ is $GT_{y \ldots x} = GT_y + GT_x \cdot EQ_y$.

* * * * *